United States Patent
Yamada

(10) Patent No.: US 8,552,747 B2
(45) Date of Patent: Oct. 8, 2013

(54) CAPACITANCE DISCRIMINATION CIRCUIT AND TOUCH SWITCH EQUIPPED WITH THE SAME

(75) Inventor: Susumu Yamada, Oizumi-machi (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 291 days.

(21) Appl. No.: 12/976,182

(22) Filed: Dec. 22, 2010

(65) Prior Publication Data
US 2011/0148439 A1 Jun. 23, 2011

(30) Foreign Application Priority Data
Dec. 22, 2009 (JP) ................................. 2009-290567

(51) Int. Cl.
*G01R 27/26* (2006.01)
(52) U.S. Cl.
USPC ........................................... 324/679; 324/678
(58) Field of Classification Search
USPC .................................................. 324/678, 679
See application file for complete search history.

(56) References Cited

U.S. PATENT DOCUMENTS

| 4,552,118 | A | * | 11/1985 | Fukaya | .......................... 123/609 |
| 7,589,538 | B2 | * | 9/2009 | Novikov et al. | .............. 324/676 |
| 2006/0055416 | A1 | * | 3/2006 | Kinoshita et al. | ............. 324/658 |
| 2007/0247172 | A1 | * | 10/2007 | Li | ................................. 324/687 |

FOREIGN PATENT DOCUMENTS

JP 2000-065514 A 3/2000

* cited by examiner

*Primary Examiner* — Vincent Q Nguyen
(74) *Attorney, Agent, or Firm* — Westerman, Hattori, Daniels & Adrian, LLP

(57) ABSTRACT

In some embodiments, a capacitance discrimination circuit includes first and second capacitors, a comparator configured to compare a first voltage of the first capacitor and a second voltage of the second capacitor, a counter circuit configured to perform a count operation based on a comparison result of the comparator, a charge circuit configured to charge the first and second capacitors, and a control circuit configured to control the charge circuit so as to charge either the first capacitor or the second capacitor based on the comparison result of the comparator. The capacitance discrimination of the first and second capacitors is performed based on count values of the counter circuit. The capacitance discrimination circuit preferably includes a discharge circuit to discharge electric charges stored in the first and second capacitors in accordance with a discharge signal from the control circuit.

16 Claims, 7 Drawing Sheets

CAPACITANCE DISCRIMINATION CIRCUIT AND TOUCH SWITCH EQUIPPED WITH THE SAME This application claims priority under 35 U.S.C. §119 to Japanese Patent Application No. 2009-290567 filed on Dec. 22, 2009, the entire disclosure of which is incorporated herein by reference in its entirety.

BACKGROUND OF THE INVENTION

1. Field of the Invention

Some preferred embodiments of the present invention relate to a capacitance discrimination circuit configured to discriminate capacitance added to a terminal, a touch switch equipped with the capacitance discrimination circuit, and a capacitance discrimination method.

2. Description of the Related Art

The following description sets forth the inventor's knowledge of related art and problems therein and should not be construed as an admission of knowledge in the prior art.

As an input device for various electronics devices, such as, e.g., a mobile phone, a mobile audio device, a handheld gaming gadget, a television, or a personal computer, conventionally known is a device called a touch switch or a touch sensor equipped with electrode switches (hereinafter simply referred to as "touch switch" in this document) configured to discriminate whether or not the switch is being touched by a finger of a user by detecting capacitance changes thereof. For example, this kind of input device is disclosed by Japanese Unexamined Laid-open Patent Application Publication No. 2000-65514 (JP-A-2000-65514).

In such a conventional touch switch configured to detect capacitance changes, it is discriminated whether or not the touch switch, more specifically an electrode switch provided on a touch panel, is being touched by a finger of a user by measuring a voltage of a capacitor attached to a terminal (electrode switch).

FIG. 5 is an explanatory view of an operation of a touch switch. This touch switch has two electrode switches 1a and 1b on a touch panel P, and is configured to discriminate whether or not the electrode switch is being touched by a finger F of a user. In this switch, since a finger F of a user has a capacitance C2', when a finger F touches the electrode switch 1b, the capacitance C2' of the finger F is added to the capacitance C2 of the electrode switch 1b. In this case, as compared with the electrode switch is to which no finger is being touched, the electrode switch 1b becomes larger in capacitance.

FIG. 6 shows voltage increase changes of two capacitors C1 and C2 different in capacitance. As shown in this figure, these capacitors C1 and C2 are different in voltage increase rate, causing a difference in time required for each capacitor to reach a reference voltage Vref, which enables discrimination of a difference of capacitance in these capacitors C1 and C2. At this time, provided that the capacitor C1 and the capacitor C2 are designed to have the same capacitance, since the apparent capacitance of the capacitor C2 is larger than that of the capacitor C1, it can be discriminated that the electrode switch having the larger apparent capacitance C2 is being touched by a finger of a user. This principle can be utilized in a touch switch.

In the aforementioned conventional touch switch configured to detect capacitance changes, however, the time required for the capacitor to reach the reference voltage Vref was simply measured, and therefore there was a problem that the measured time was readily affected by external noises.

For example, in some cases, external noises may cause a slower voltage increase rate of the electrode switch even if the switch is not being touched by a finger of a user. In such a case, the conventional touch switch may sometimes recognize that the slower voltage increase rate was caused by a touch of a user's finger to the electrode switch, and may erroneously discriminate that the touch switch is being touched by a finger of a user.

FIG. 7 is a graph showing voltage changes of a capacitor in which the solid line shows a voltage change in cases where the capacitor is not affected by noise and the dashed-line shows a voltage change in cases where the capacitor is affected by noise. In cases where the capacitor is not affected by noise, as shown in the solid line, as electric charges are added gradually, the voltage increases smoothly. On the other hand, in cases where the capacitor is affected by noise, as shown in the dashed line, even if electric charges are added gradually, the voltage does not increase smoothly, resulting in unsteady voltage increase, which causes erroneous discrimination.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a capacitance discrimination circuit capable of assuredly discriminating capacitance changes while minimizing external noise influence.

Among other potential advantages, some embodiments can provide a touch panel equipped with the capacitance discrimination circuit.

Among other potential advantages, some embodiments can provide a capacitance discrimination method capable of assuredly discriminating capacitance changes while minimizing external noise influence.

According to a first aspect of the present invention, among other potential advantages, some embodiments can provide a capacitance discrimination circuit including a first capacitor, a second capacitor, a comparator configured to compare a first voltage of the first capacitor and a second voltage of the second capacitor, a counter circuit configured to perform a count operation based on a comparison result of the comparator, a charge circuit configured to charge the first capacitor and the second capacitor, and a control circuit configured to control the charge circuit so as to charge either the first capacitor or the second capacitor based on a comparison result of the comparator. The capacitance discrimination of the first capacitor and the second capacitor is performed based on count values of the counter circuit.

In some examples, it can be configured such that the counter circuit includes a first counter configured to perform a count operation when the comparison result of the comparator is a first value, a second counter configured to perform a count operation when the comparison result of the comparator is not the first value, and a third counter configured to count a predetermined time period. In this circuit, when it is discriminated by the third counter that the predetermined time period has passed, the capacitance discrimination of the first capacitor and the second capacitor is performed based on the count values of the first counter and the second counter.

In some examples, it can be configured such that the capacitance discrimination circuit further includes a discharge circuit configured to discharge electric charges stored in the first capacitor and the second capacitor. This discharge circuit causes discharging of the electric charges stored in the first capacitor and the second capacitor in accordance with a discharge signal from the control circuit.

According to a second aspect of the present invention, some preferred embodiments provide a touch switch equipped with the aforementioned capacitance discrimination circuit. The touch switch is configured to discriminate whether or not a finger of a user is being touched based on the discrimination result of the capacitance discrimination circuit.

According to a third aspect of the present invention, some preferred embodiments provide a capacitance discrimination method of discriminating capacitance of a plurality of capacitors. The method includes the steps of comparing voltages of the plurality of capacitors, performing a count operation on one of the plurality of capacitors lowest in voltage based on a comparison result of the voltages of the plurality of capacitors to obtain a count value on each of the plurality of capacitors, charging one of the plurality of capacitors lowest in voltage based on the comparison result of the voltages of the plurality of capacitors, and discriminating capacitance of the plurality of capacitors based on the count values of the count operation.

According to the aforementioned capacitance discrimination circuit, it is possible to assuredly discriminate capacitance changes of capacitors while minimizing external noise influence. The same effects can also be obtained by the aforementioned touch switch and capacitance discrimination method.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the present invention will be described by way of example and not limitation. It should be understood based on this disclosure that various other modifications can be made by those in the art based on these illustrated embodiments.

Figure 1:
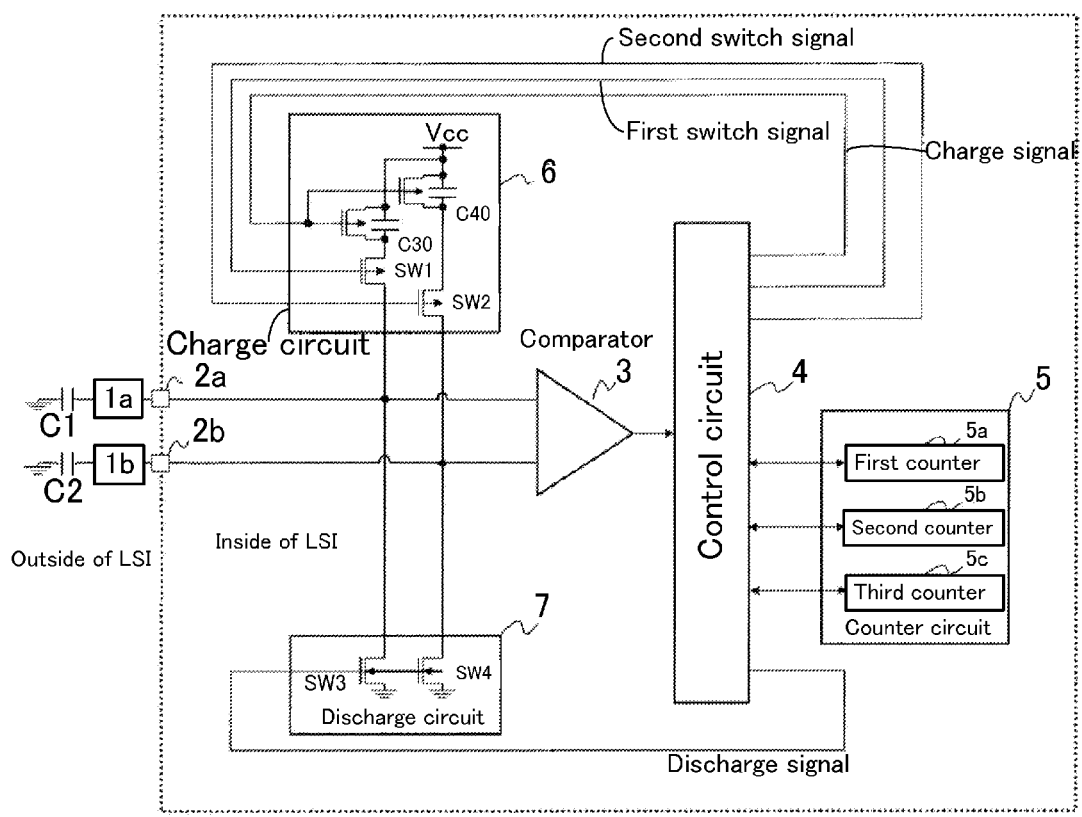
FIG. 1 is a block diagram of a capacitance discrimination circuit according to a first embodiment of the present invention.

Hereinafter, some preferable embodiments of the present invention will be explained with reference to the attached drawings. FIG. 1 shows a block diagram of a capacitance discrimination circuit. A touch panel has a first electrode (terminal) 1a and a second electrode (terminal) 1b provided thereon. One end of the first electrode 1a is connected by one end of a first capacitor C1 with the other end of the capacitor grounded, and similarly one end of the second electrode 1b is connected by one end of a second capacitor C2 with the other end of the capacitor grounded. These electrodes 1a and 1b are connected to first and second terminals 2a and 2b of an LSI circuit at their other ends, respectively, so that the voltages of the first and second capacitors C1 and C2 are applied to the LSI circuit.

The LSI circuit includes a comparator 3 having a non-inverting terminal and an inverting terminal to which signals from the capacitors C1 and C2 are input respectively. With this structure, voltages of the capacitors C1 and C2 can be compared. The comparison result is output to a control circuit 4. The control circuit 4 samples the comparison result upon receipt of a clock signal. When it is discriminated by the sampling result that the voltage of the first capacitor C1 is lower than that of the second capacitor C2, a counter circuit 5 causes a count-up operation of a first counter 5a. To the contrary, when it is discriminated by the sampling result that the voltage of the first capacitor C1 is higher than that of the second capacitor C2 (i.e., the voltage of the second capacitor C2 is lower than that of the first capacitor C1), the counter circuit 5 causes a count-up operation of a second counter 5a. The counter circuit 5 has a third counter 5c which measures a prescribed time period. The third counter 5c starts the counting operation upon receipt of a start signal from the control circuit 4, and sends a termination flag signal to the control circuit 4 when the counter overflows. The control circuit 4 receives this termination flag signal to recognize that the prescribed time period has passed, and compares the count values of the first counter 5a and the second counter 5b.

The control circuit 4 outputs a charge signal, a first switch signal, and a second switch signal. Upon receipt of a charge signal, the capacitor C30 and the capacitor C40 in the charge circuit 6 are charged by a certain amount of electric charges. Although the capacitors C30 and C40 can be provided outside of the LSI circuit, since these capacitors C30 and C40 are merely required to store a small amount of electric charges, it is preferable to have such capacitors C30 and C40 built-in the LSI circuit, which can reduce the production cost by eliminating the number of external parts.

In a state in which the capacitors C30 and C40 are charged in accordance with the charge signal, when the first switch signal becomes active, a first MOS transistor SW1 turns on, causing charging of the first capacitor C1 connected to the first electrode is by the electric charges stored in the capacitor C30. Similarly, when the second switch signal becomes active, a second MOS transistor SW2 turns on, causing charging of the second capacitor C2 by the electric charges stored in the capacitor C40.

Figure 2:
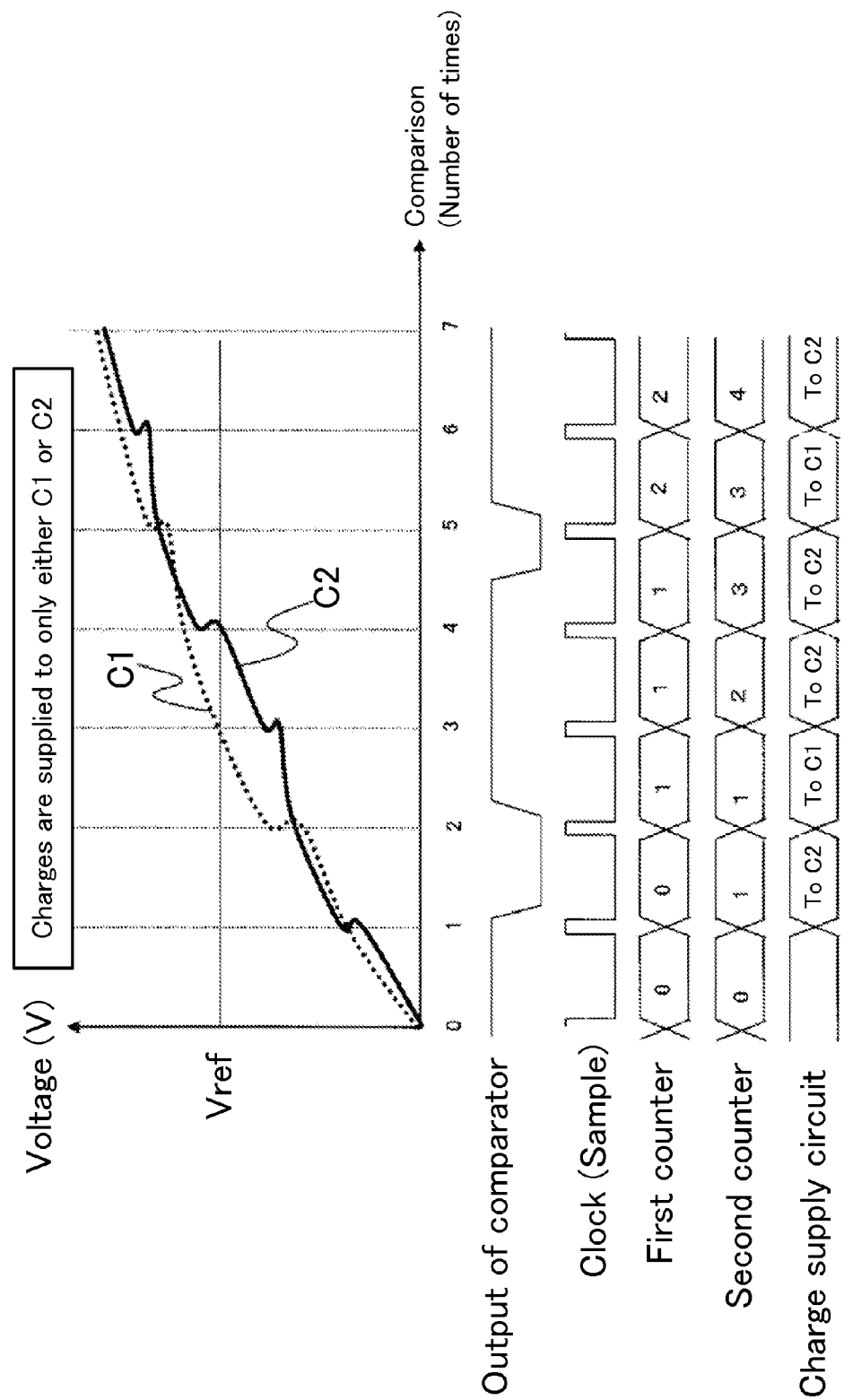
FIG. 2 is a timing chart of the capacitance discrimination circuit of the embodiment.

FIG. 2 is a timing chart of the aforementioned operation. Comparing the voltages of the capacitors C1 and C2, no charge is supplied to the capacitor higher in voltage, while a certain amount of charge is supplied to the capacitor lower in voltage. More specifically, in the initial comparison, since the voltage of the capacitor C2 is lower than that of the capacitor C1, the second counter 5b counts up, and electric charges are supplied only to the capacitor C2. In the second comparison, the voltage of the capacitor C1 becomes lower than that of the capacitor C2, and therefore the first counter 5a counts up, and electric charges are supplied only to the capacitor C1. Repeating the aforementioned operation, at the time when the sixth comparison has completed, the count value of the second counter 5b is "4," and the count value of the first counter 5a is "2." This reveals that the electric potential of the capacitor C2 larger in count value hardly rises. In other words, the capacitance of the capacitor C2 is large, which makes it possible to discriminate that a finger of a human (user) having an additional capacitance is in contact with the second electrode 1b.

A conventional touch switch can be affected by noises entered via the terminal as discussed previously. In this embodiment of the present invention, since the voltage comparison between the electrodes of the touch switch is performed, an influence by common noises entered in both electrodes can be ignored. Furthermore, no high-performance A/D and/or D/A converter is required, which becomes possible to perform high accuracy capacitance discrimination with relatively simple structure. Provided that electric charges remain in the capacitors C1 and C2, electric charges are initially kept supplied only to one of capacitors C1 and C2 lower in voltage. However, the other capacitor becomes lower in voltage in due course. When this voltage inversion between the capacitors C1 and C2 occurred, by setting the count value of each of the first and second counters 5a and 5b to zero (0), the measurement error due to the initial electric charges can be cancelled. Thereafter, by comparing the count value of the first counter 5a and that of the second counter 5b at the time when a prescribed time period has passed, accurate capacitance discrimination can be performed.

The aforementioned method, however, causes a waste of time until the voltage inversion of the capacitors C1 and C2 occurs, which requires a longer time for the discrimination. Shortening of the discrimination time can be attained by adding a discharge circuit 7 as shown in FIG. 1. The control circuit 4 outputs a discharge signal to the discharge circuit 7. When the discharge circuit 7 receives the discharge signal, the transistors SW3 and SW4 in the discharge circuit 7 go into an on-state, which causes discharging of both the capacitors C1 and C2.

Figure 3:
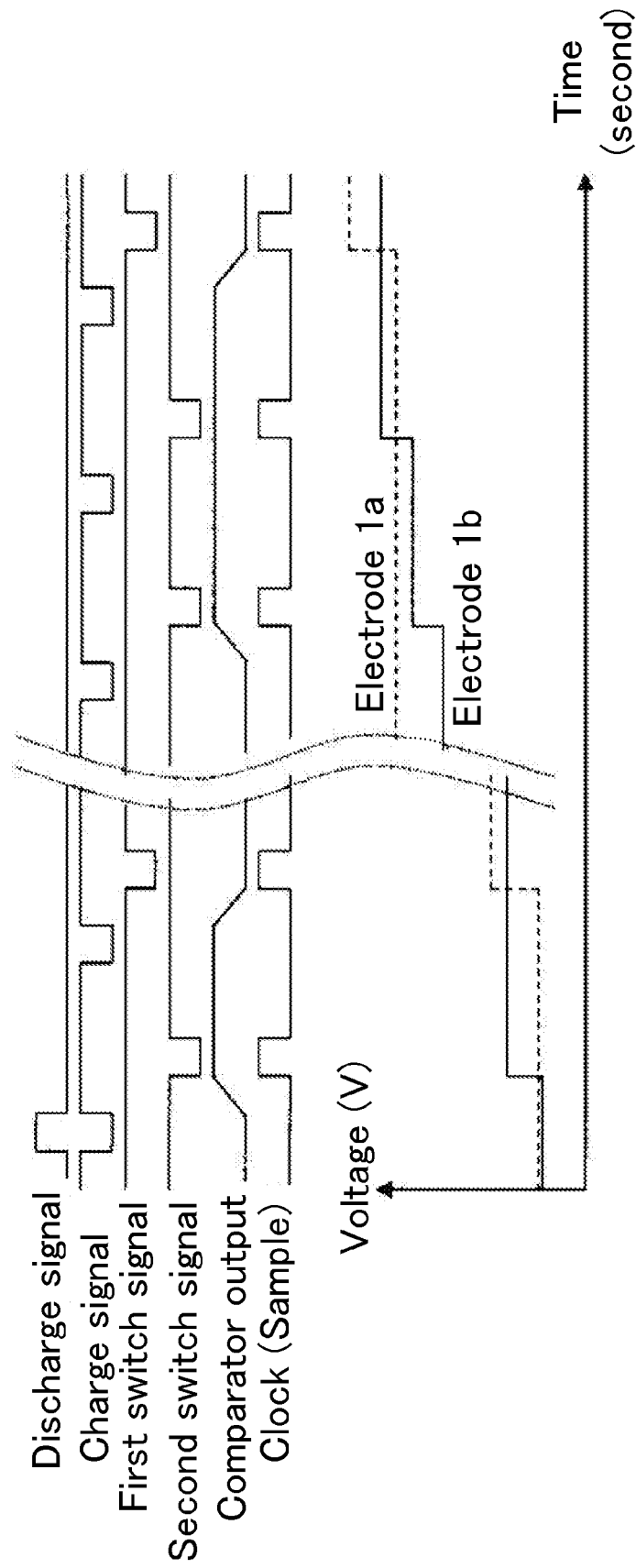
FIG. 3 shows another timing chart of the capacitance discrimination circuit of the embodiment.

FIG. 3 is a timing chart showing the case in which capacitors C1 and C2 are discharged in accordance with the discharge signal. The voltages of the electrodes 1a and 1b become equal in accordance with the input of the discharge signal. Thereafter, sampling of the outputs of the comparator 3 is performed in synchronization with a clock input, and only the capacitor connected to the electrode lower in voltage is charged using the first switch signal or the second switch signal. With this structure, by generating the discharge signal prior to the initiation of the capacitor discrimination, the capacitor discrimination can be performed without considering the remaining electric charges of the capacitors C1 and C2.

In the aforementioned technique, the capacitance of the touch switch (electrode) is discriminated by detecting the voltage increase. However, the capacitance discrimination can also be performed by detecting the voltage decrease. Although not illustrated, such capacitor discrimination can be performed by supplying sufficient electric charges to the capacitors C1 and C2, then comparing the voltages, and lowering the higher voltage by discharging a certain amount of electric charges.

Although the above explanation is directed to an embodiment in which two electrodes 1a and 1b are provided on the touch panel P, the number of electrodes is not limited to the above, and can be increased, such as, e.g., 3, 4, 5, 6, . . . , or N.

Figure 4:
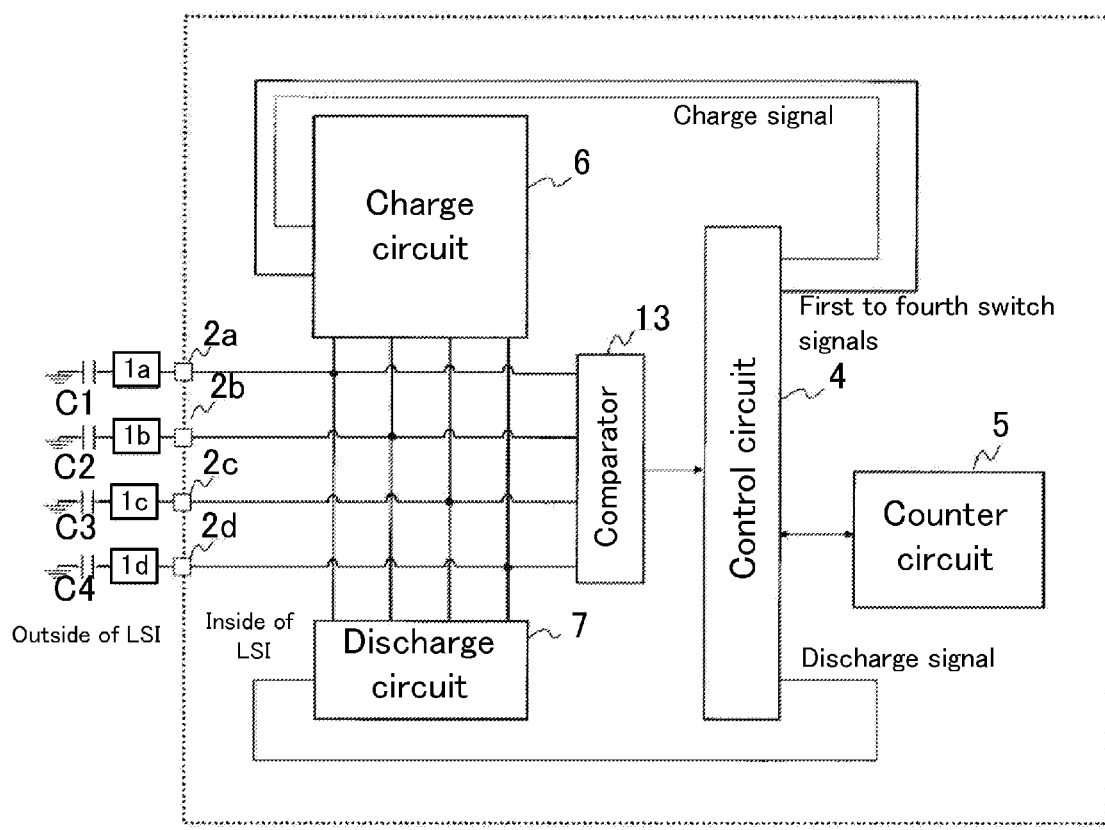
FIG. 4 is a block diagram showing a structure of a capacitance discrimination circuit according to a second embodiment of the present invention.
Figure 5:
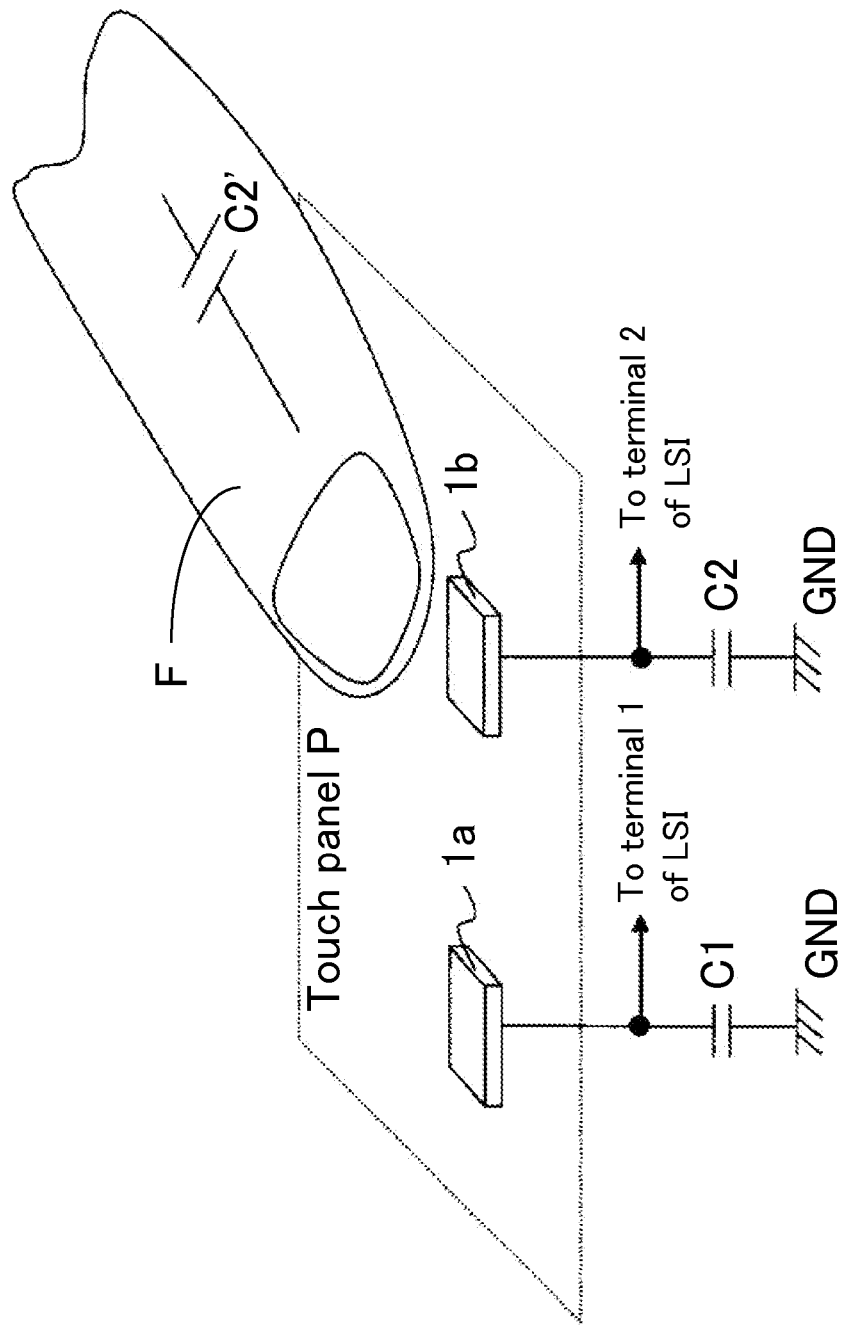
FIG. 5 is an explanatory view showing an example of an operation of a touch switch.
Figure 6:
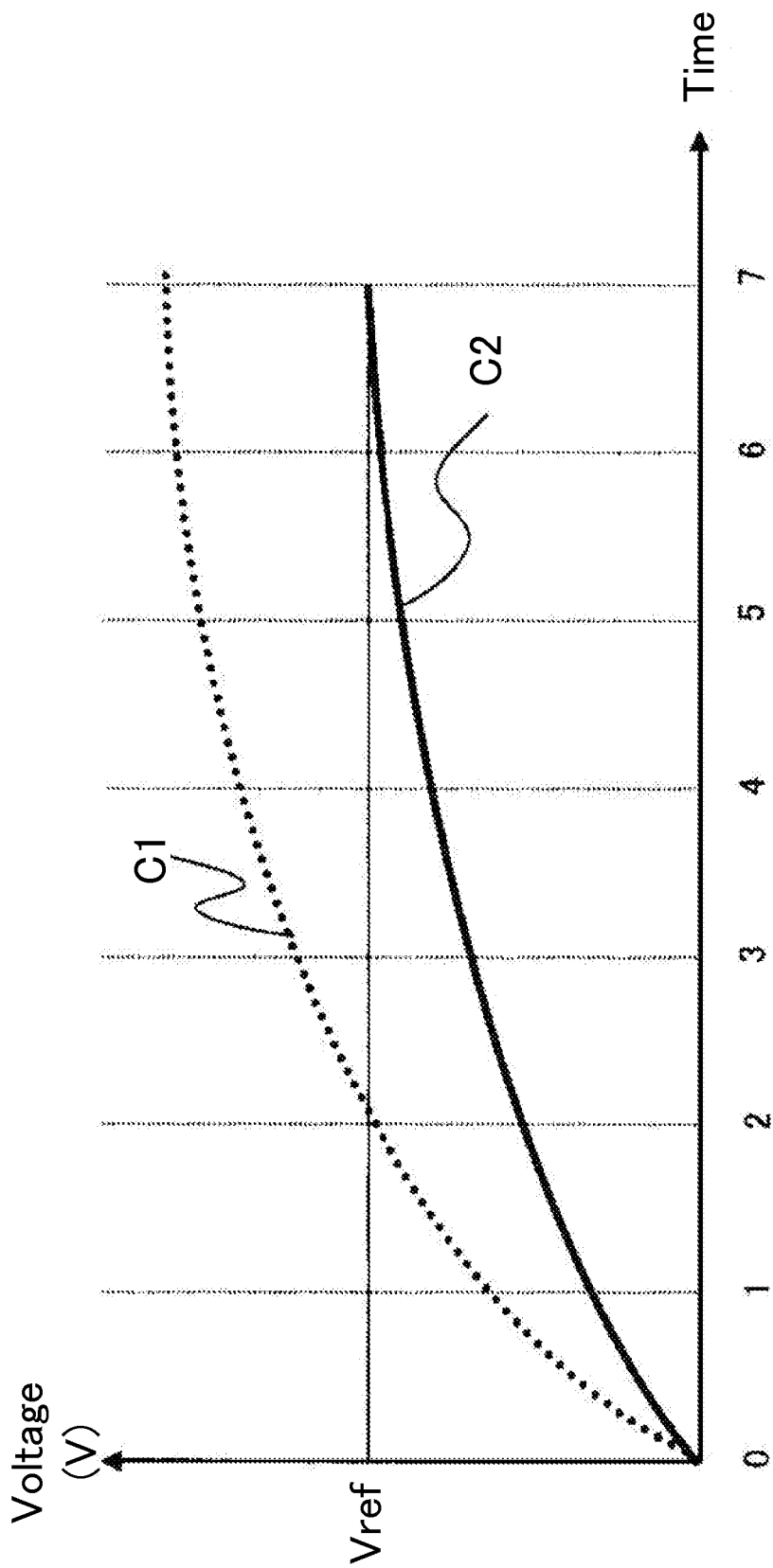
FIG. 6 shows voltage increase changes of two capacitors C1 and C2 different in capacitance.
Figure 7:
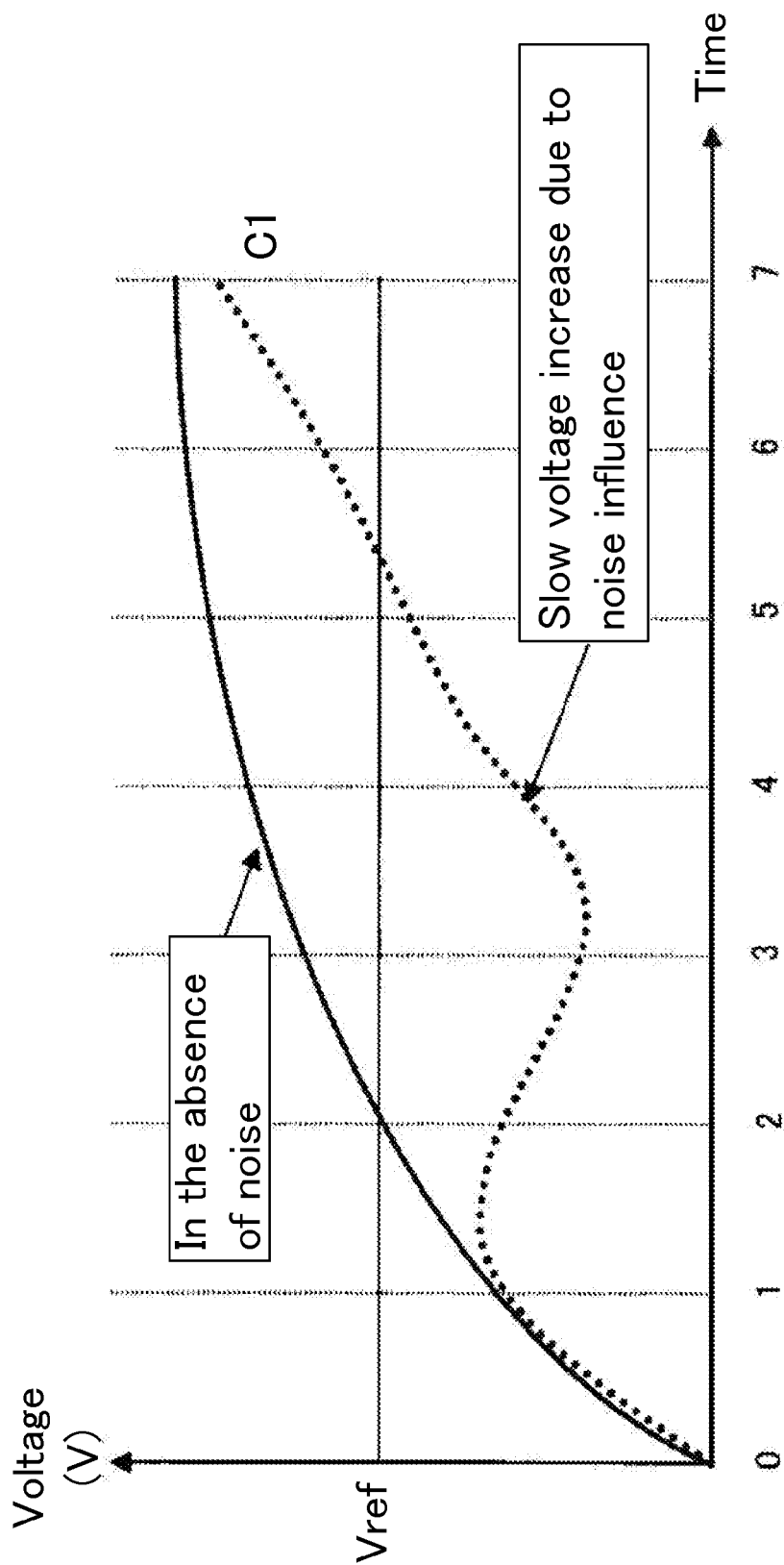
FIG. 7 shows voltage changes of a capacitor in which the solid line shows a voltage change in cases where the capacitor is not affected by noise and the dashed-line shows a voltage change in cases where the capacitor is affected by noise

FIG. 4 is a block diagram showing a capacitance discrimination circuit according to a second embodiment. Cumulative explanation on the same portions as the first embodiment shown in FIG. 1 will be omitted. In this embodiment, electrodes 1c and 1d are added and the total number of electrodes is 4 (four). The comparator 13 is configured to extract the lowest voltage among the voltages of the first to fourth electrodes 1a, 1b, 1c, and 1d. The output of the comparator 13 is supplied to the control circuit 4. The counter circuit 5 is equipped with a plurality of counters each configured to perform the count operation when the corresponding capacitor becomes the lowest voltage among the voltages of the capacitors C1 to C4. Comparing the count values of the counters enables discrimination of the capacitance of each capacitor. Even if the number of electrodes becomes N, the same capacitance discrimination can be performed.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

For example, in the above embodiment, the first counter 5a configured to operate the count-up operation when the capacitor C1 is lower in voltage than the capacitor C2, and the second counter 5b configured to operate the count-up operation when the capacitor C2 is lower in voltage than capacitor C1 are provided separately. In place of the above counters, however, by using an up/down counter, which is configured to perform a count-up operation when the capacitor C1 is lower in voltage than the capacitor C2 and a count-down operation when the capacitor C2 is lower in voltage than the capacitor C1, the same effects as mentioned above can be obtained.

The aforementioned explanation is made while referring to the case in which the capacitors C1 and C2 of the electrodes 1a and 1b are the same in capacitance. However, the present invention can be applied to the case in which the capacitors of the electrodes are different in capacitance from each other. In the same manner, the aforementioned explanation is made while referring to the case in which the capacitors C30 and C40 in the charge circuit 6 are the same in capacitance. However, the present invention can be applied to the case in which the capacitors C30 and C40 are different in capacitance. In cases where the capacitor C1 is smaller in capacitance than the capacitor C2 (C1<C2), since the voltage of the capacitor C1 quickly rises. Therefore, considering the fact, the capacitance discrimination can be performed by judging the count value of the counter circuit 5. In the same manner, if the capacitance of the capacitor C30 is twice as large as that of the capacitor C40, the electric charge of the capacitor C40 becomes equal to that of the capacitor C30 when the capacitor C40 is charged twice. Therefore, the amount of electric charges supplied to the capacitor C1 from the capacitor C30 becomes twice as large as the amount of electric charges supplied to the capacitor C2 from the capacitor C40. Considering the fact, the capacitance discrimination can be performed by judging the count value.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as a non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:
1. A capacitance discrimination circuit comprising:
a first capacitor;
a second capacitor;
a comparator configured to compare a first voltage of the first capacitor and a second voltage of the second capacitor;
a counter circuit configured to perform a count operation based on a comparison result of the comparator;
a charge circuit configured to charge the first capacitor and the second capacitor; and
a control circuit configured to control the charge circuit so as to charge one of the first capacitor and the second capacitor lower in voltage based on a comparison result of the comparator,
wherein capacitance discrimination of the first capacitor and the second capacitor is performed based on count values of the counter circuit.
2. A capacitance discrimination circuit comprising:
a first capacitor;
a second capacitor;
a comparator configured to compare a first voltage of the first capacitor and a second voltage of the second capacitor;
a counter circuit configured to perform a count operation based on a comparison result of the comparator;
a charge circuit configured to charge the first capacitor and the second capacitor; and
a control circuit configured to control the charge circuit so as to charge either the first capacitor or the second capacitor based on a comparison result of the comparator, wherein capacitance discrimination of the first capacitor and the second capacitor is performed based on count values of the counter circuit;
wherein the counter circuit includes:
a first counter configured to perform a count operation when the comparison result of the comparator is a first value;
a second counter configured to perform a count operation when the comparison result of the comparator is not the first value; and
a third counter configured to count a predetermined time period,
wherein, when it is discriminated by the third counter that the predetermined time period has passed, the capacitance discrimination of the first capacitor and the second capacitor is performed based on the count values of the first counter and the second counter.
3. The capacitance discrimination circuit as recited in claim 2, further comprising a discharge circuit configured to discharge electric charges stored in the first capacitor and the second capacitor, wherein the discharge circuit causes discharging of the electric charges stored in the first capacitor and the second capacitor in accordance with a discharge signal from the control circuit.
4. The capacitance discrimination circuit as recited in claim 2, wherein the first counter is configured to perform a count-up operation when it is discriminated by the comparator that the first capacitor is lower in voltage than the second capacitor, and wherein the second counter is configured to perform a count-up operation when it is discriminated by the comparator that the second capacitor is lower in voltage than the first capacitor.
5. The capacitance discrimination circuit as recited in claim 1,
further comprising a discharge circuit configured to discharge electric charges stored in the first capacitor and the second capacitor, wherein the discharge circuit causes discharging of the electric charges stored in the first capacitor and the second capacitor in accordance with a discharge signal from the control circuit.
6. The capacitance discrimination circuit as recited in claim 1, wherein the counter is an up/down counter configured to perform a count-up operation when it is discriminated by the comparator that the first capacitor is lower in voltage than the second capacitor and a count-down operation when it is discriminated by the comparator that the second capacitor is lower in voltage than the first capacitor.
7. The capacitance discrimination circuit as recited in claim 1, wherein the capacitance discrimination circuit is built-in an LSI circuit.
8. The capacitance discrimination circuit as recited in claim 1, wherein:
the capacitance discrimination circuit includes N pieces of capacitors including the first and second capacitors;
the comparator is configured to compare voltages of the N pieces of capacitors;
the counter circuit has counters corresponding to each of the N pieces of capacitors and configured to perform a count operation based on a comparison result of the comparator;

the charge circuit is configured to charge the N pieces of capacitors;

the control circuit is configured to control the charge circuit so as to charge one of the capacitors lowest in voltage among the N pieces of capacitors based on the comparison result of the comparator; and capacitance discrimination of the N pieces of capacitors is performed based on count values of the counter circuit.

9. The capacitance discrimination circuit as recited in claim 8, further comprising a discharge circuit configured to discharge electric charges stored in the N pieces of capacitors, wherein the discharge circuit causes discharging of the electric charges stored in the N pieces of capacitors in accordance with a discharge signal from the control circuit.

10. A touch switch equipped with the capacitance discrimination circuit as cited in claim 1, wherein the touch switch is configured to discriminate whether or not a finger of a user is being touched based on the discrimination result of the capacitance discrimination circuit.

11. The touch switch as recited in claim 10, wherein the counter circuit includes:
a first counter configured to perform a count operation when the comparison result of the comparator is a first value;
a second counter configured to perform a count operation when the comparison result of the comparator is not the first value; and
a third counter configured to count a predetermined time period,
wherein, when it is discriminated by the third counter that the predetermined time period has passed, the capacitance discrimination of the first capacitor and the second capacitor is performed based on the count values of the first counter and the second counter.

12. The touch switch as recited in claim 10, further comprising a discharge circuit configured to discharge electric charges stored in the first capacitor and the second capacitor, wherein the discharge circuit causes discharging of the electric charges stored in the first capacitor and the second capacitor in accordance with a discharge signal from the control circuit.

13. The touch switch as recited in claim 10, wherein the first counter is configured to perform a count-up operation when it is discriminated by the comparator that the first capacitor is lower in voltage than the second capacitor, and wherein the second counter is configured to perform a count-up operation when it is discriminated by the comparator that the second capacitor is lower in voltage than the first capacitor.

14. The touch switch as recited in claim 10, wherein the counter is an up/down counter configured to perform a count-up operation when it is discriminated by the comparator that the first capacitor is lower in voltage than the second capacitor and a count-down operation when it is discriminated by the comparator that the second capacitor is lower in voltage than the first capacitor.

15. A capacitance discrimination method of discriminating capacitance of a plurality of capacitors, the method comprising the steps of:
comparing voltages of the plurality of capacitors;
performing a count operation on one of the plurality of capacitors lowest in voltage based on a comparison result of the voltages of the plurality of capacitors to obtain a count value on each of the plurality of capacitors;
charging one of the plurality of capacitors lowest in voltage based on the comparison result of the voltages of the plurality of capacitors; and
discriminating capacitance of the plurality of capacitors based on the count values of the count operation.

16. The capacitance discrimination method of discriminating capacitance of a plurality of capacitors as recited in claim 15, further comprising a step of discharging electric charges stored in the plurality of capacitors prior to the step of comparing the voltages of the plurality of capacitors.

* * * * *